United States Patent
Perng et al.

(10) Patent No.: US 8,766,431 B2
(45) Date of Patent: Jul. 1, 2014

(54) POWER MOSFET PACKAGE

(71) Applicant: Xintec Inc., Jhongli (TW)

(72) Inventors: Baw-Ching Perng, Baoshan Township (TW); Ying-Nan Wen, Hsinchu (TW); Shu-Ming Chang, New Taipei (TW); Ching-Yu Ni, Hsinchu (TW); Yun-Ji Hsieh, Gongguan Township (TW); Wei-Ming Chen, Hsinchu (TW); Chia-Lun Tsai, Tainan (TW); Chia-Ming Cheng, New Taipei (TW)

( * ) Notice: Subject to any disclaimer, the term of this patent is extended or adjusted under 35 U.S.C. 154(b) by 0 days.

(21) Appl. No.: 13/828,537

(22) Filed: Mar. 14, 2013

(65) Prior Publication Data

US 2013/0193520 A1     Aug. 1, 2013

Related U.S. Application Data

(62) Division of application No. 12/756,915, filed on Apr. 8, 2010, now Pat. No. 8,410,599.

(60) Provisional application No. 61/257,423, filed on Nov. 2, 2009, provisional application No. 61/178,829, filed on May 15, 2009.

(51) Int. Cl.
    *H01L 23/04*         (2006.01)

(52) U.S. Cl.
    USPC ............... 257/698; 257/401; 257/E23.174

(58) Field of Classification Search
    USPC ................... 257/401, 698, E23.174
See application file for complete search history.

(56) References Cited

U.S. PATENT DOCUMENTS

| | | | |
|---|---|---|---|
| 2008/0067585 A1* | 3/2008 | Williams et al. | 257/330 |
| 2010/0044791 A1* | 2/2010 | Hebert | 257/341 |

* cited by examiner

*Primary Examiner* — Daniel Whalen
(74) *Attorney, Agent, or Firm* — Liu & Liu

(57) ABSTRACT

A power MOSFET package includes a semiconductor substrate having opposite first and second surfaces, having a first conductivity type, and forming a drain region, a doped region extending downward from the first surface and having a second conductivity type, a source region in the doped region and having the first conductivity type, a gate overlying or buried under the first surface, wherein a gate dielectric layer is between the gate and the semiconductor substrate, a first conducting structure overlying the semiconductor substrate, having a first terminal, and electrically connecting the drain region, a second conducting structure overlying the semiconductor substrate, having a second terminal, and electrically connecting the source region, a third conducting structure overlying the semiconductor substrate, having a third terminal, and electrically connecting the gate, wherein the first, the second, and the third terminals are substantially coplanar, and a protection layer between the semiconductor substrate and the terminals.

10 Claims, 16 Drawing Sheets

POWER MOSFET PACKAGE

CROSS REFERENCE TO RELATED APPLICATIONS

This Application is a Divisional of U.S. Application Ser. No.12/756,915, filed on Apr. 8, 2010, now U.S. Pat. No. 8,410,599, which claims the benefit of U.S. Provisional Application No. 61/178,829, filed on May 15, 2009 and U.S. Provisional Application No. 61/257,423, filed on Nov. 2, 2009, the entirety of which are incorporated by reference herein.

BACKGROUND OF THE INVENTION

1. Field of the Invention

The present invention relates to a power MOSFET package, and in particular relates to a wafer-level power MOSFET package.

2. Description of the Related Art

FIGS. 1A and 1B respectively show a cross-sectional view and a three-dimensional view of a conventional power MOSFET package 10. As shown in FIGS. 1A and 1B, a power MOSFET chip 12 is disposed on a conducting carrier 16 and packaged in a body 14. The power MOSFET chip 12 has a gate contact region and a source contact region (not shown). The power MOSFET package 10 includes a pin 18g electrically connected to the gate contact region and a pin 18s electrically connected to the source contact region. The pins 18g and 18s further extend through the body 14. The power MOSFET chip 12 includes a drain contact region (not shown). The drain contact region is electrically connected to a pin 18d extending through the body 14 through the conducting carrier 16 thereunder.

However, in the package mentioned above, the power MOSFET devices need to be packaged into bodies one by one. The pins also need to be formed one by one. A lot of time and effort are needed. In addition, the body and the pin occupy a lot of space, which makes the forming of a small sized package difficult. The requirement of a smaller and lighter electronic product can not be satisfied.

BRIEF SUMMARY OF THE INVENTION

According to an illustrative embodiment of the present invention, a power MOSFET package is provided. The package includes a semiconductor substrate having a first surface and an opposite second surface, wherein the semiconductor substrate has a first conductivity type and forms a drain region, a doped region extending downward from the first surface, the doped region having a second conductivity type, a source region located in the doped region and having the first conductivity type, a gate formed overlying the first surface or buried under the first surface, wherein a gate dielectric layer is located between the gate and the semiconductor substrate, a first conducting structure located overlying the semiconductor substrate and having a first terminal, the first conducting structure electrically connected to the drain region, a second conducting structure located overlying the semiconductor substrate and having a second terminal, the second conducting structure electrically connected to the source region, a third conducting structure located overlying the semiconductor substrate and having a third terminal, the third conducting structure electrically connected to the gate, wherein the first terminal, the second terminal, and the third terminal are substantially coplanar, and a protection layer located between the semiconductor substrate and the first terminal, the second terminal, and the third terminal.

According to an illustrative embodiment of the present invention, a power MOSFET package is provided. The package includes a semiconductor substrate having a first surface and an opposite second surface, wherein the semiconductor substrate has a first conductivity type and forms a drain region, a doped region extending downward from the first surface, the doped region having a second conductivity type, a source region located in the doped region and having the first conductivity type, a gate formed overlying the first surface or buried under the first surface, wherein a gate dielectric layer is located between the gate and the semiconductor substrate, a first trench extending from a first side surface of the semiconductor substrate toward an inner portion of the semiconductor substrate and extending from the first surface toward the second surface, a first conducting layer located overlying a sidewall of the first trench, wherein the first conducting layer is not coplanar with the first side surface and is separated from the first side surface by a first minimum distance, the first conducting layer electrically connected to the source region, a first insulating layer located between the first conducting layer and the semiconductor substrate, a second trench extending from a second side surface of the semiconductor substrate toward an inner portion of the semiconductor substrate and extending from the first surface toward the second surface, a second conducting layer located overlying a sidewall of the second trench, wherein the second conducting layer is not coplanar with the second side surface and separated from the second side surface by a second minimum distance, the second conducting layer electrically connected to the drain region, a second insulating layer located between the second conducting layer and the semiconductor substrate, a third trench extending from a third side surface of the semiconductor substrate toward an inner portion of the semiconductor substrate and extending from the first surface toward the second surface, a third conducting layer located overlying a sidewall of the third trench, wherein the third conducting layer is not coplanar with the third side surface and separated from the third side surface by a third minimum distance, the third conducting layer electrically connected to the gate, and a third insulating layer located between the third conducting layer and the semiconductor substrate.

According to an illustrative embodiment of the present invention, a chip package is provided. The chip package includes a chip body having at least a side surface, at least a trench extending from the side surface toward an inner portion of the chip body, at least an insulating layer conformally covering the trench, at least a conducting pattern located overlying the insulating layer, and a predetermined distance is between the side surface and the conducting pattern in the trench such that a portion of the insulating layer is exposed, and at least a chip electrically connected to the conducting pattern.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," or "overlying," (and like descriptions) a second layer include embodiments where the first and second layers are in direct contact, and those where one or more layers are interposing the first and second layers.

In an embodiment of the invention, a power MOSFET package is formed by a wafer-level packaging. Terminals of a gate contact, source contact, and drain contact of the power MOSFET are led to a substantially same plane through, for example, a through-substrate via (TSV). Packaging cost may be significantly reduced, and a smaller package may be formed. Contacts of the formed power MOSFET package are substantially located on the same plane, facilitating integration with other electronic elements by, for example, flip-chip packaging.

Figure 1A:
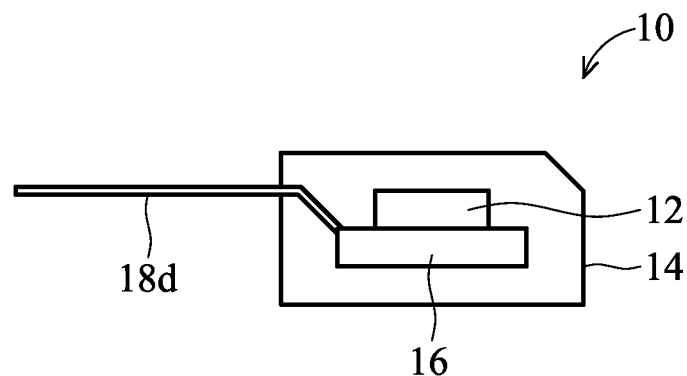
FIGS. 1A and 1B respectively show a cross-sectional view and a three-dimensional view of a conventional power MOSFET package.
Figure 1B:
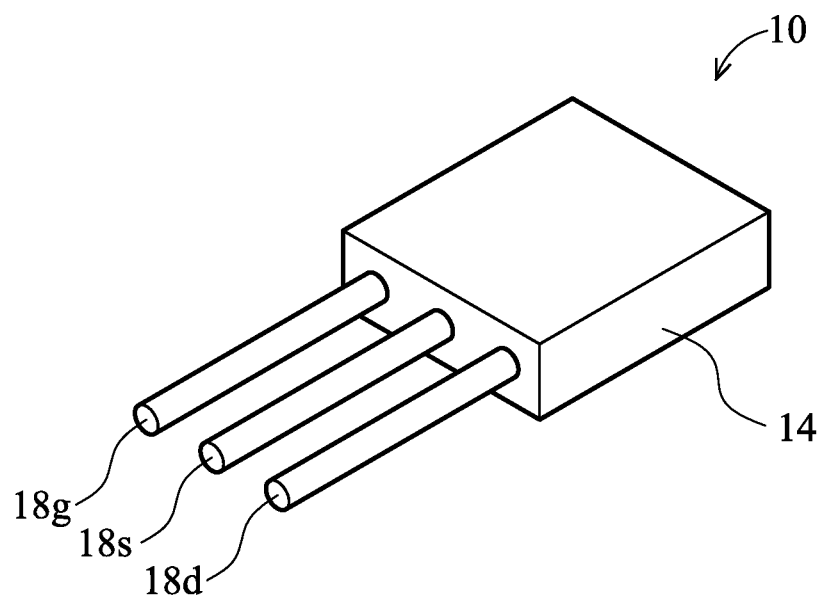
Figure 2A:
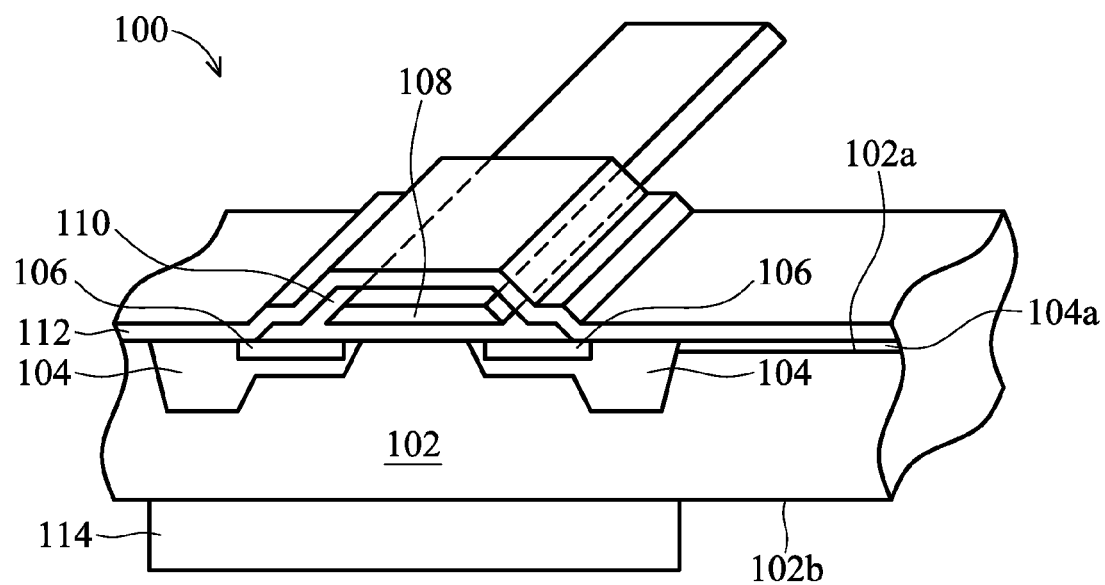
FIGS. 2A-2B are illustrative views showing a power MOSFET chip according to an embodiment of the present invention.

First, a power MOSFET package according to an embodiment of the present invention is illustrated with references made to the accompanying drawings. FIG. 2A shows an illustrative three-dimensional view of a power MOSFET chip 100 according to an embodiment of the invention. The power MOSFET chip 100 includes a semiconductor substrate 102 having a first surface 102a and an opposite second surface 102b. The conductivity type of the semiconductor substrate 102 may be n-type or p-type. Typically, an n-type semiconductor substrate is commonly used. Take an n-type semiconductor substrate 102 as an example, the semiconductor substrate 102 may be a silicon substrate doped with an n-type dopant. Type or doping concentration of the dopant in the semiconductor substrate 102 may not be uniform. For example, type or doping concentration of an n-type dopant doped in a lower portion of the semiconductor substrate 102 may be different from those of an n-type dopant doped in an upper portion of the semiconductor substrate 102. The semiconductor substrate 102 itself forms a drain region of the power MOSFET chip 100. Thus, the reference number 102 also represents the drain region of the power MOSFET chip 100.

The power MOSFET chip 100 includes a doped region 104 extending downward from the first surface 102a. The conductivity type of the doped region 104 is different from that of the semiconductor substrate 102. For example, when the semiconductor substrate 102 is an n-type substrate, the conductivity type of the doped region 104 is p-type, and vice versa.

The power MOSFET chip 100 includes a source region 106 located in the doped region 104. The conductivity types of the source region 106 and the semiconductor substrate 102 are the same, such as n-type. In this embodiment, the source region 106 extends downward from the first surface 102a and is partially surrounded by the doped region 104.

The power MOSFET chip 100 includes a gate 108 which may be, for example, a polysilicon layer. A gate dielectric layer 110 is placed between the gate 108 and the semiconductor substrate 102. In addition, in another embodiment, the gate and the gate dielectric layer may be a buried structure formed in a recess of the substrate.

In the embodiment shown in FIG. 2A, a source electrode layer 112 is formed overlying the semiconductor substrate 102. The source electrode layer 112 is electrically connected to the source region 106 and electrically insulated from the gate 108. An insulating layer 104a is placed between the semiconductor substrate 102 and the source electrode layer 112. The insulating layer 104a may be replaced by a doped region 104a, such as a p-type doped region, extending from the doped region 104. In another embodiment, the gate dielectric layer and the source insulating layer 104a may be formed simultaneously. The other exposed surface of the substrate may be used as a drain contact region. The source electrode layer 112 forms an ohmic contact with the source region 106. In addition, a drain electrode layer 114 may be formed underlying the semiconductor substrate (drain region) 102. The drain electrode layer 114 forms an ohmic contact with the drain region 102.

When a voltage is applied to the gate 108, a channel is formed in the doped region 104. By applying an electrical field, an electron flow or a current may flow between the source electrode layer 112, the source region 106, the drain region 102, and the drain electrode layer 114.

Figure 2B:
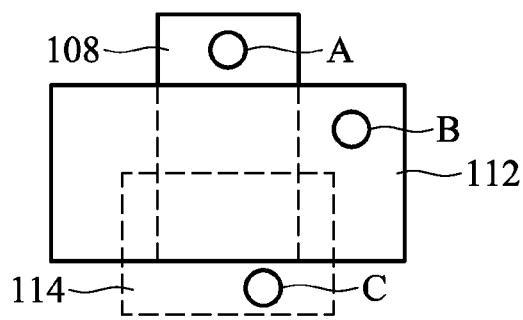

FIG. 2B illustratively shows dispositions of the drain electrode layer 114, the source electrode layer 112, and the gate 108 according to an embodiment of the invention. In one embodiment, a conducting structure electrically connected to the gate 108 may be formed at the position A, which may include, for example, a solder ball. A conducting structure electrically connected to the source region 112 may be formed at position B, which may also include a solder ball. Thus, in this embodiment, terminals of the conducting structures respectively and electrically connected to the gate 108 and the source region 106 (through the source electrode layer 112) may be substantially coplanar by controlling the sizes of the solder balls. In one embodiment, a conducting structure electrically connected to the drain region 102 may be formed at the position C, which may include a through-substrate conducting structure and a solder ball. In this embodiment, the conducting path to the drain region 102 is led upward from the second surface 102b to the first surface 102a through the drain electrode layer 114 and the through-substrate conducting structure, such that three terminals of the gate contact, the source contact, and the drain contact of the power MOSFET chip 100 are substantially coplanar. A protection layer may be formed between the three terminals and the semiconductor substrate 102 to accomplish a power MOSFET package according to an embodiment of the present invention.

The power MOSFET package according to an embodiment of the invention is preferably formed by a wafer-level packaging such that a plurality of chips can be packaged in a single packaging process flow, significantly reducing manufacturing cost and time. Further, packages with smaller sizes are formed. Because contact terminals of the formed power MOSFET packages are located on substantially the same plane, it is easier for the packages to be integrated with other electronic elements by, for example, flip-chip packaging.

In the following figures, a plurality of power MOSFET packages according to embodiments of the present invention are illustrated with references made to the cross-sectional views shown in FIGS. 3A-3H. Wherein, same or similar reference numbers are used to designate same or similar elements for understanding embodiments of the invention more easily.

Figure 3A:
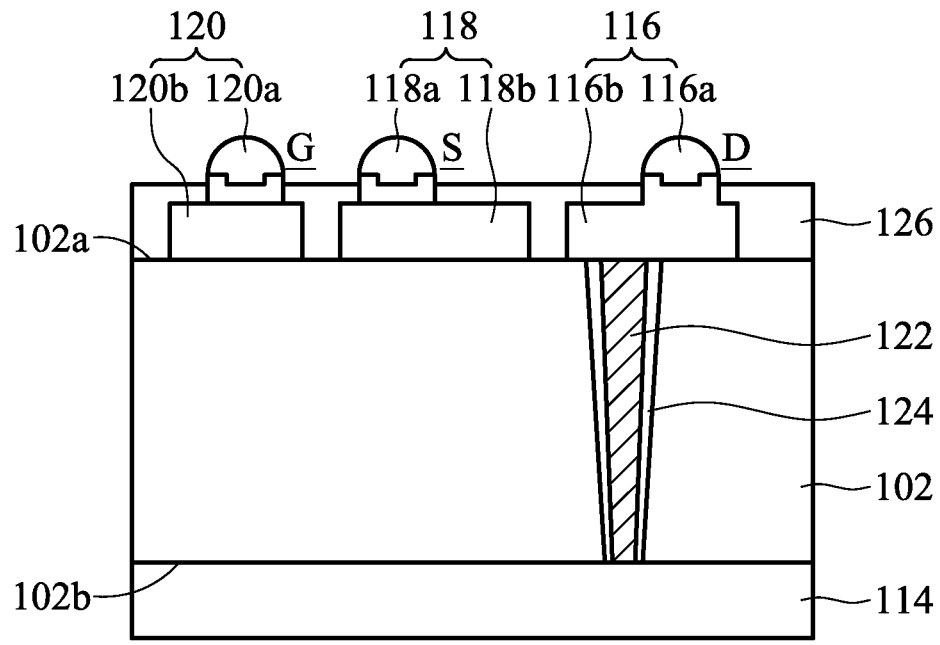
FIGS. 3A-3H are cross-sectional views of power MOSFET packages according to embodiments of the present invention.

In the embodiment shown in FIG. 3A, the package includes a first conducting structure 116 located overlying an exposed surface of the semiconductor substrate 102 (also served as the drain region 102). The first conducting structure 116 is electrically connected to the drain region 102 through a first through-substrate conducting structure 122 and the drain electrode layer 114. In this embodiment, a first insulating layer 124 is located between the first through-substrate conducting layer 122 and the semiconductor substrate 102 (or the drain region 102). It should be noted that the first through-substrate conducting layer 122 does not contact with the doped region 104 or the source region 106. The first conducting structure 116 may include, for example, a contact pad 116b and a solder ball 116a. The package further includes a second conducting structure 118 located overlying the source electrode layer on the semiconductor substrate 102 and electrically connected to the source region (not shown in this figure; see FIG. 2). The second conducting structure 118 may include, for example, a contact pad 118b and a solder ball 118a. The package further includes a third conducting structure 120 located overlying the gate electrode layer on the semiconductor substrate 102 and electrically connected to the gate (not shown in this figure; see FIG. 2). The third conducting structure 120 may include, for example, a contact pad 120b and a solder ball 120a. In this embodiment, a first terminal, such as a top end of the solder ball 116a, of the conducting structure 116 electrically connected to the drain region may be substantially coplanar with a second terminal of the second conducting structure 118 and a third terminal of the third conducting structure 120 through the first through-substrate conducting structure 122, facilitating the integration with other electronic elements by flip-chip packaging. A protection layer 126 is further formed between these terminals and the semiconductor substrate 102. In this embodiment, it is preferable that a silicon wafer is used as the semiconductor substrate 102 for performing a wafer-level packaging. Then, a dicing process is performed to separate individual packages.

Figure 3B:
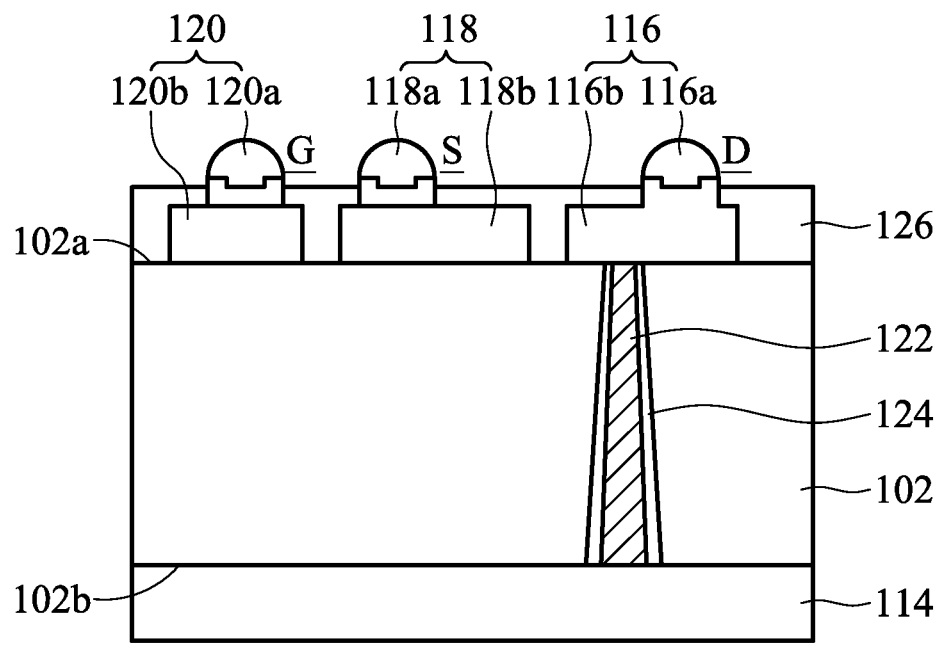

The embodiment shown in FIG. 3B is similar to that shown in FIG. 3A. The main difference is that the first through-substrate conducting structure 122 shown in FIG. 3A is formed by forming a hole penetrating through the substrate from the first surface 102a by etching, followed by filling a conducting layer into the hole. For the embodiment shown in FIG. 3B, a hole penetrating the substrate is formed from the second surface 102b by etching, followed by filling a conducting layer into the hole. Thus, for the first through-substrate conducting structure 122 of the embodiment shown in FIG. 3B, its cross-sectional area at the first surface 102a is smaller than its cross-sectional area at the second surface 102b, contrary to that shown in FIG. 3A.

Figure 3C:
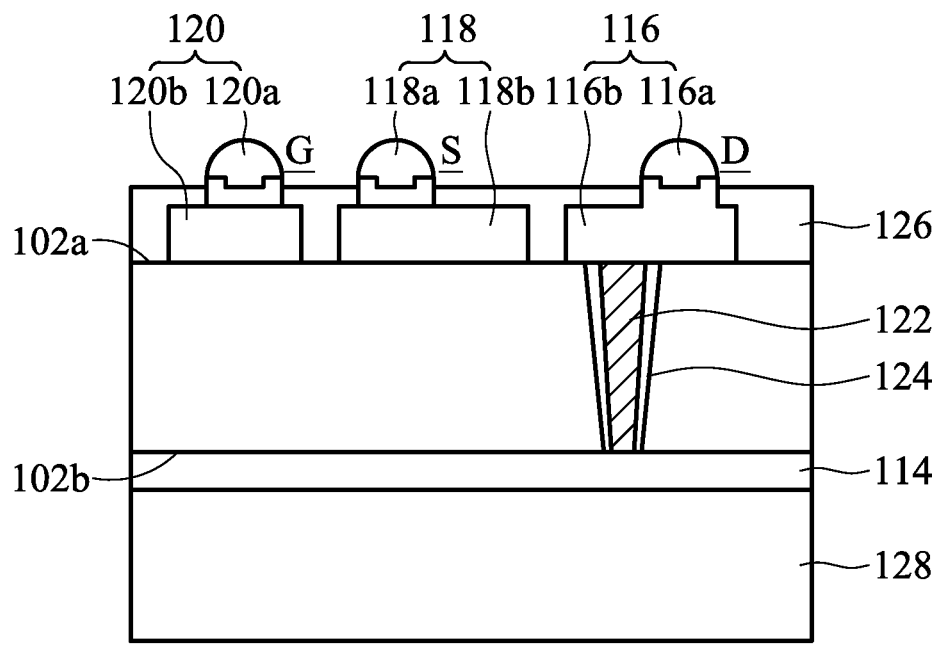

The embodiment shown in FIG. 3C is similar to that shown in FIG. 3A. The main difference therebetween is that the package shown in FIG. 3C further includes a heat dissipation layer 128. The heat dissipation layer 128 benefits to heat dissipation of the chip during operation. The material of the heat dissipation layer 128 may include any material with good thermal conductance, which may be a metal material or non-metallic material. When a wafer-level packaging is applied, it is preferable to use a non-metallic heat dissipation layer for the following dicing process because the dicing of dice is performed after the forming of the heat dissipation layer, wherein a material such as Si, AN, $Al_2O_3$, or SiC may be adopted.

Figure 3D:
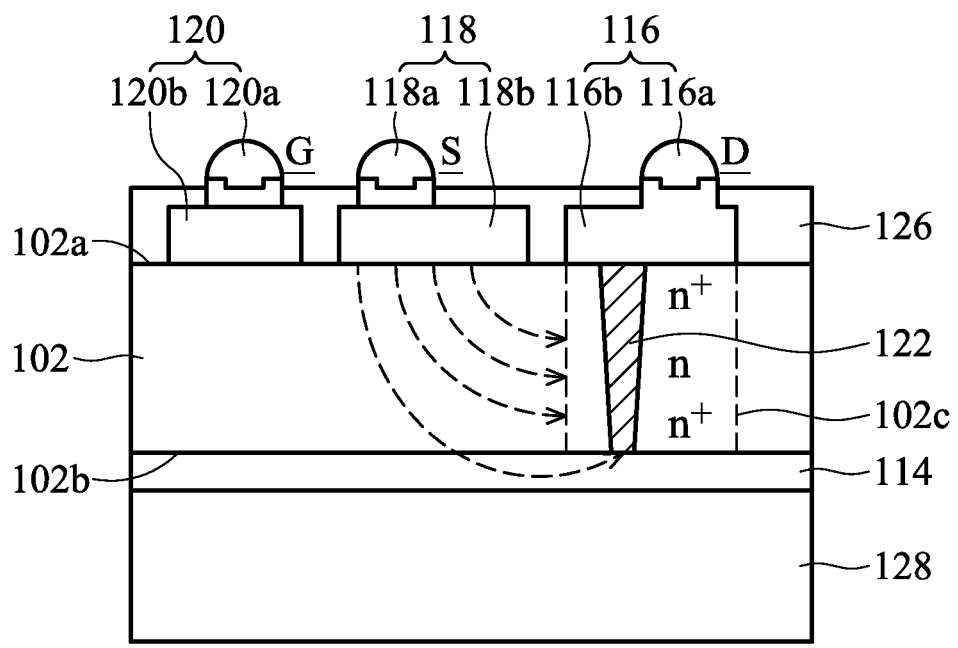

The embodiment shown in FIG. 3D is similar to that shown in FIG. 3C. The main difference therebetween is that no insulating layer is formed between the first through-substrate conducting structure 122 and the semiconductor substrate 102 (also serving as the drain region 102). The first through-substrate conducting structure 122 is electrically connected to the drain region 102, and it is preferable that the through-substrate conducting structure 122 forms an ohmic contact with the drain region 102. In order to conduct current between the source region and the drain region at a higher speed, the first through-substrate conducting structure 122 is disposed at a position next to the source region and relatively far away from the gate region. In addition, a doped region 102c surrounding the first through-substrate conducting structure 122 is composed of a dopant with a single conductivity type including an n-type dopant. In another embodiment, in order to conduct current between the source region and the drain region at a higher speed, a region of longer conducting paths, such as the bottom portion of the substrate near the drain electrode layer 114, may be chosen to be doped with a higher dopant concentration compared with the doped region in an upper portion of the substrate. Alternatively, a sandwich structure may be formed such that dopant concentrations of the doped region in an upper portion and a lower portion of the substrate are both higher than that of the doped region in the middle portion of the substrate. In this embodiment, current or electron flow may directly flow from the source region S to the first through-substrate conducting structure 122 and further be led to the solder ball 116a. The first through-substrate conducting structure 122 and the surrounding doped region 102c together with the drain electrode layer 114 may together conduct current or electron flow. In another embodiment, the drain electrode layer 114 may be omitted, and only the first through-substrate conducting structure 122 and the surrounding doped region 102c are used to conduct current or electron flow.

In the embodiments shown in FIGS. 3A-3D, the conducting path electrically connected to the drain region is led to the first surface through the first through-substrate conducting structure 122. However, embodiments of the present invention are not limited thereto. In the embodiment shown in FIG. 3E, a second through-substrate conducting structure 130 electrically connected to the source region is used to lead a conducting path electrically connected to the source region to the second surface 102b. In addition, a third through-substrate conducting structure 132 electrically connected to the gate further is used to lead a conducting path electrically connected to the gate to the second surface 102b. The second through-substrate conducting structure 130 and the third through-substrate conducting structure 132 are electrically connected to the second conducting structure 118 and the third conducting structure 120 located on the second surface 102b, respectively. In this embodiment, the terminals of the first conducting structure 116, the second conducting structure 118, and the third conducting structure 120 are still substantially coplanar, facilitating a following flip-chip packaging. In addition, in the embodiment shown in FIG. 3E, a second insulating layer 134 is located between the second through-substrate conducting structure 130 and the semiconductor substrate 102 while a third insulating layer 136 sits between the third through-substrate conducting structure 132 and the semiconductor substrate 102. However, in another embodiment, there may be no insulating layer between the second through-substrate conducting structure 130 and the semiconductor substrate 102, and a doped region having an opposite conductivity type may be used for instead.

The packages according to embodiments of the invention are not limited to the examples mentioned above, in which a through-substrate conducting structure is used to make each terminal, such as a top end of the solder ball, substantially coplanar. For example, in the embodiment shown in FIG. 3F, the semiconductor substrate 102 is disposed on a bottom portion of a cavity 202 of a semiconductor carrier substrate 200. In this embodiment, the first conducting structure 116 is electrically connected to the drain region and is disposed overlying an upper surface of the semiconductor carrier substrate 200. As shown in FIG. 3F, the first conducting structure is electrically connected to the drain region through a redistribution layer 204. In this embodiment, the semiconductor carrier substrate is preferable to a wafer having a plurality of cavities formed therein. Thus, a wafer-level packaging may be performed. Through the redistribution layers, contacts of the power MOSFET chips are all led to a substantially same plane. Then, a dicing process is performed to form a plurality of packages.

Figure 3E:
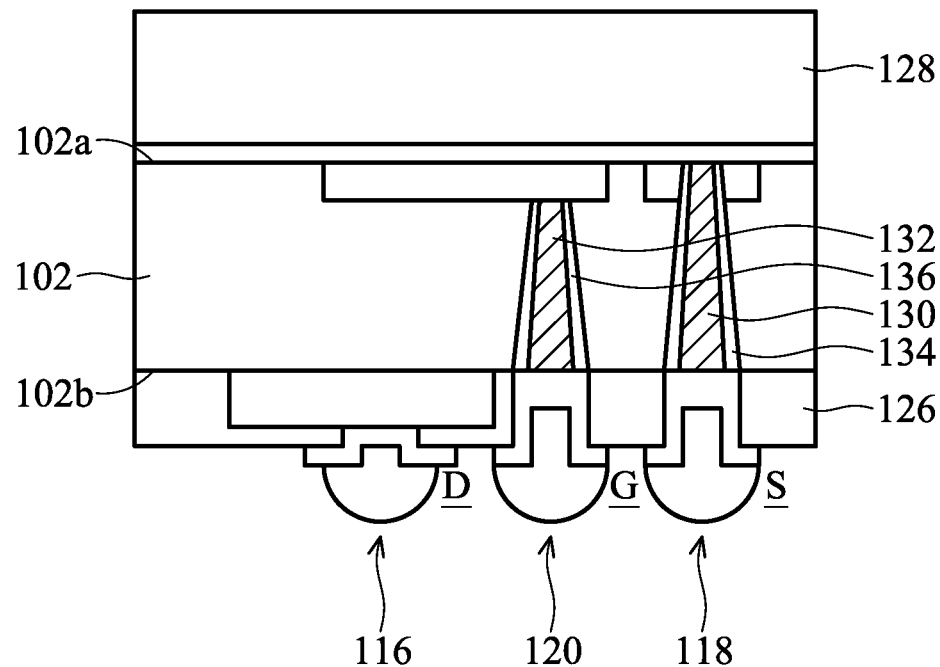
Figure 3F:
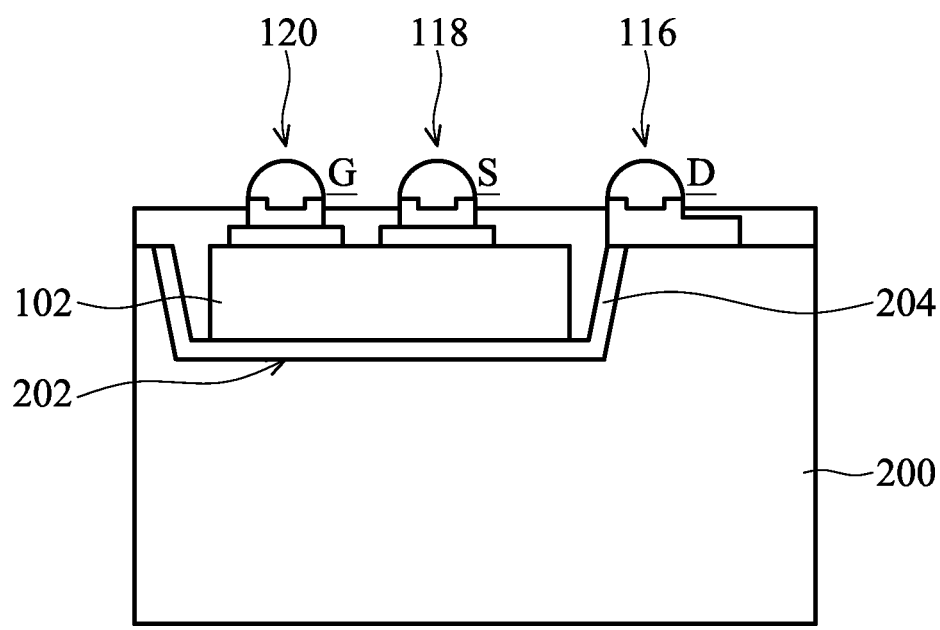
Figure 3G:
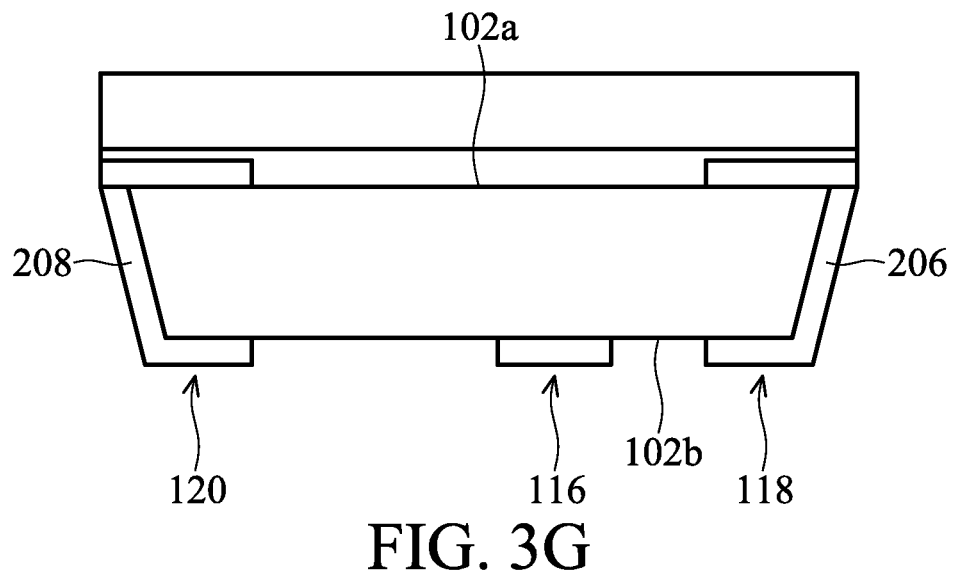
Figure 3H:
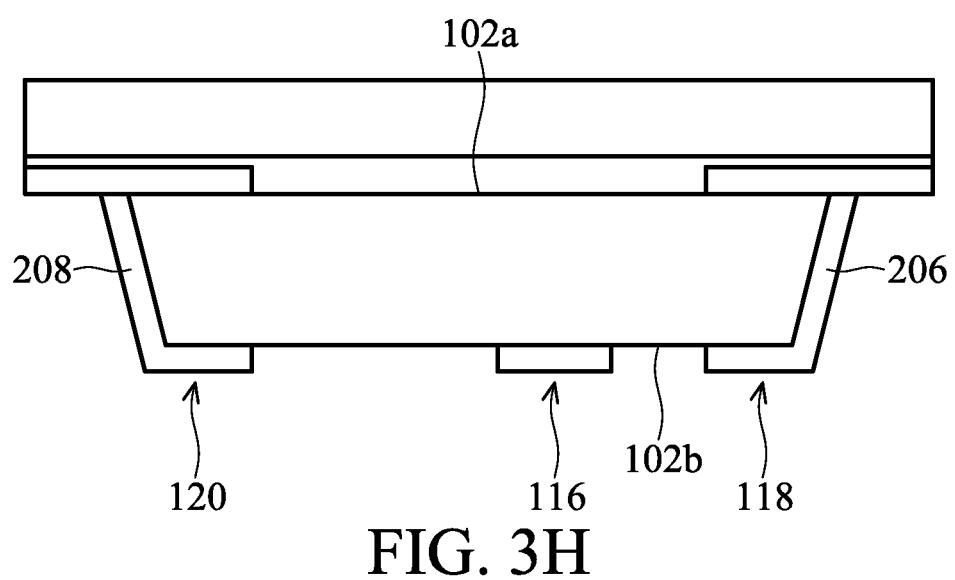

In the embodiments shown in FIGS. 3G and 3H, a redistribution layer 206 may be used to lead a conducting path electrically connected to the source region to the second conducting structure 118 disposed overlying the second surface 102b while a redistribution layer 208 may be used to lead a conducting path electrically connected to the gate to the third conducting structure 120 disposed overlying the second surface 102b. Thus, contacts of the power MOSFET chip are also led to substantially the same plane.

Although in the embodiments shown in FIGS. 3A-3E mentioned above, the through-substrate conducting structure is located directly under a pad, embodiments of the present invention are not limited thereto. In another embodiment, the through-substrate conducting structure may be electrically connected to the pad through a redistribution layer. In this case, the through-substrate conducting structure is electrically connected to the conducting structure through a redistribution layer.

Figure 4A:
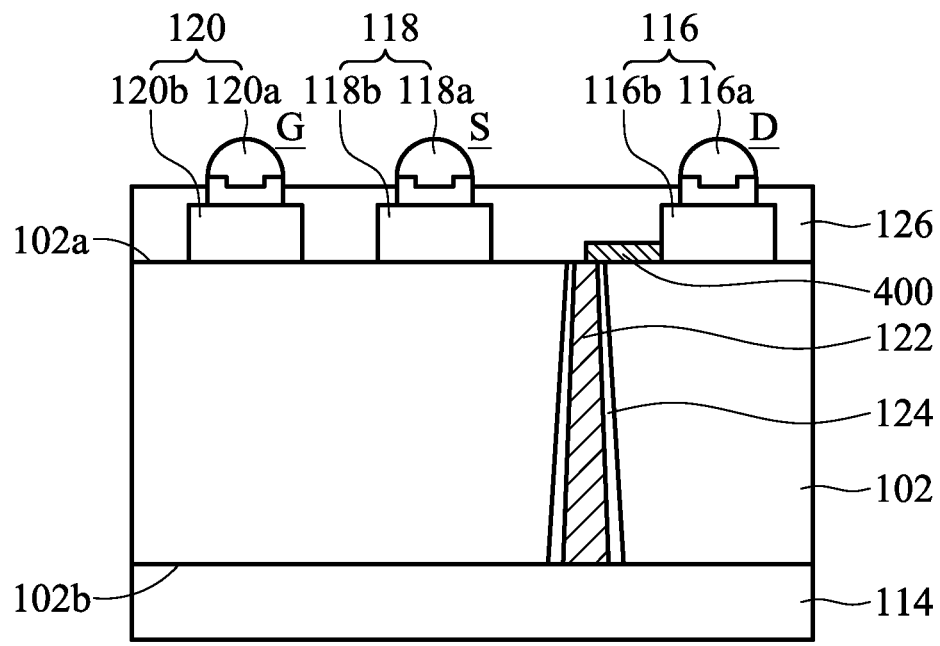
FIGS. 4A-4B are cross-sectional views of power MOSFET packages according to embodiments of the present invention.
Figure 4B:
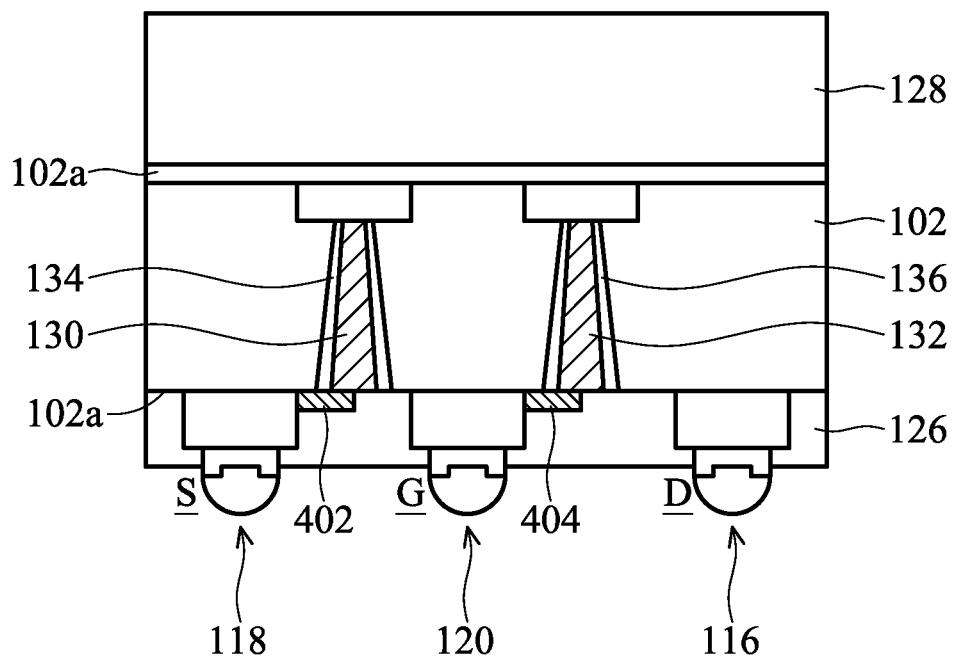

FIGS. 4A-4B are cross-sectional views of power MOSFET packages according to embodiments of the present invention. The embodiment shown in FIG. 4A is similar to that shown in FIG. 3A. The main difference therebetween is that the first through-substrate conducting structure 122 is not directly under the first conducting structure 116. In this embodiment, the package further includes a redistribution layer 400 located overlying the semiconductor substrate 102, which forms an electrical connection between the first through-substrate conducting structure 122 and the first conducting structure 116. For example, the redistribution layer 400 may be electrically connected to both the first through-substrate conducting structure 122 and the contact pad 116b.

The embodiment shown in FIG. 4B is similar to that shown in FIG. 3E. The main difference therebetween is that the second through-substrate conducting structure 130 is not directly under the second conducting structure 118 while the third through-substrate conducting structure 132 is not directly under the third conducting structure 120. In this embodiment, the package further includes a redistribution layer 402 located overlying the semiconductor substrate 102, which forms an electrical connection between the second through-substrate conducting structure 130 and the second conducting structure 118. In addition, this embodiment further includes a redistribution layer 404 located overlying the semiconductor substrate 102, which forms an electrical connection between the third through-substrate conducting structure 132 and the third conducting structure 120. In the embodiments shown in FIGS. 4A-4B, the conducting structures, such as the solder balls, may be disposed at specific positions depending on requirement through the use of the redistribution layers.

In the embodiments mentioned above, although the through-substrate conducting structure fills the through-hole completely, embodiments of the present invention are not limited thereto. In another embodiment, the through-substrate conducting structure may merely be conformally formed overlying the sidewall of the through-hole without completely filling the through-hole.

Thereinafter, a power MOSFET package and manufacturing method thereof according to another embodiment of the present invention is illustrated with references made to the accompany figures. In this embodiment, a wafer-level packaging process is adopted to form a power MOSFET package. Further, a through-substrate conducting structure is formed at the scribe line to form a power MOSFET package having a sidewall contact.

Figure 5A:
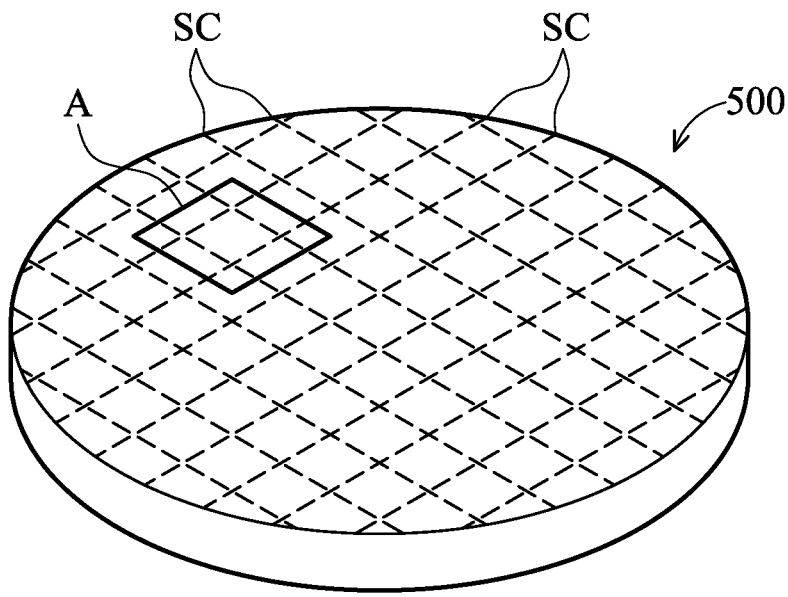
FIGS. 5A-5F are three-dimensional views showing the steps of forming a power MOSFET package according to an embodiment of the present invention.
Figure 5B:
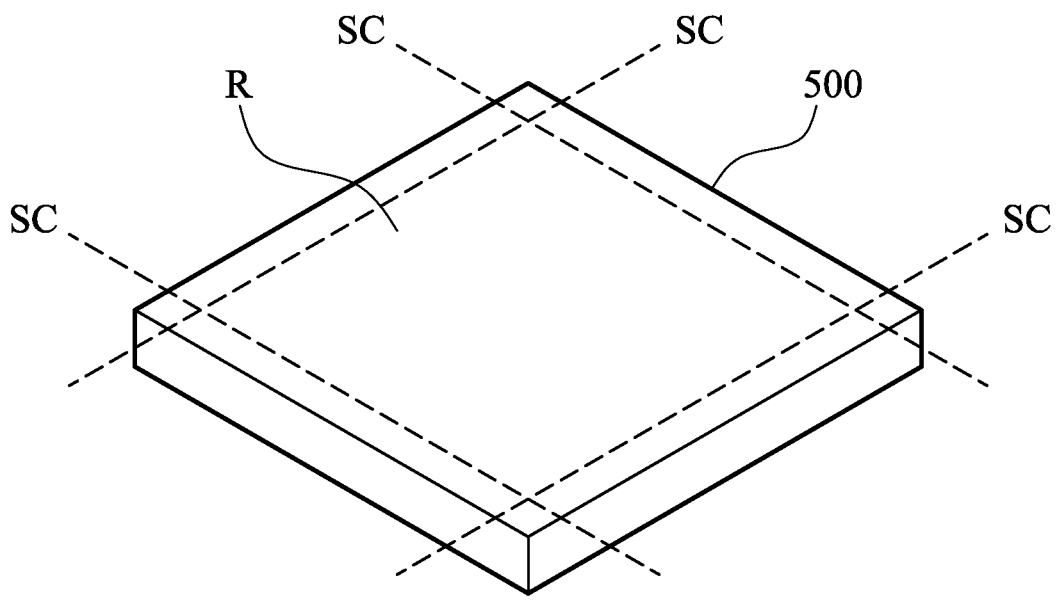
Figure 5C:
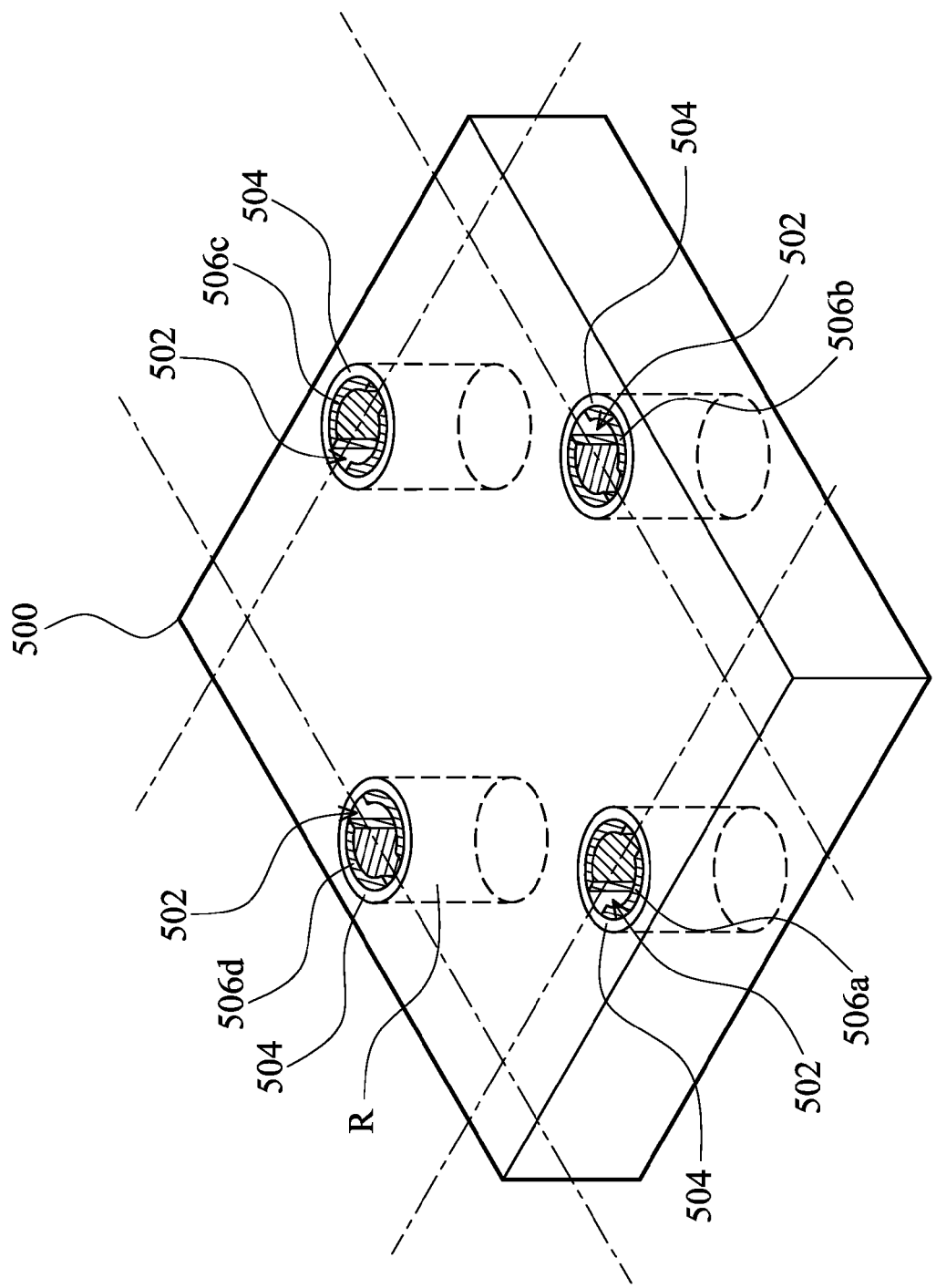
Figure 5D:
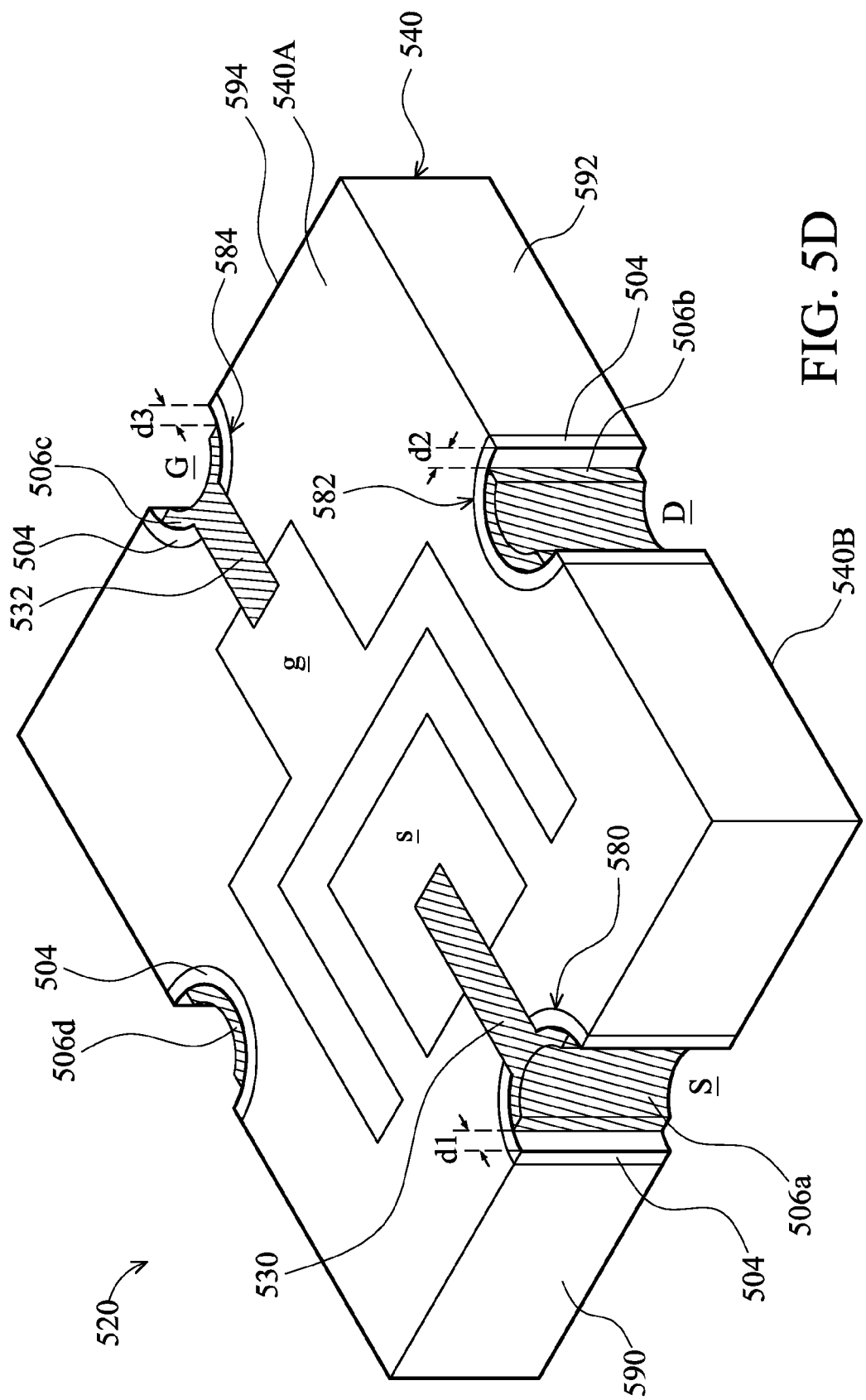
Figure 5E:
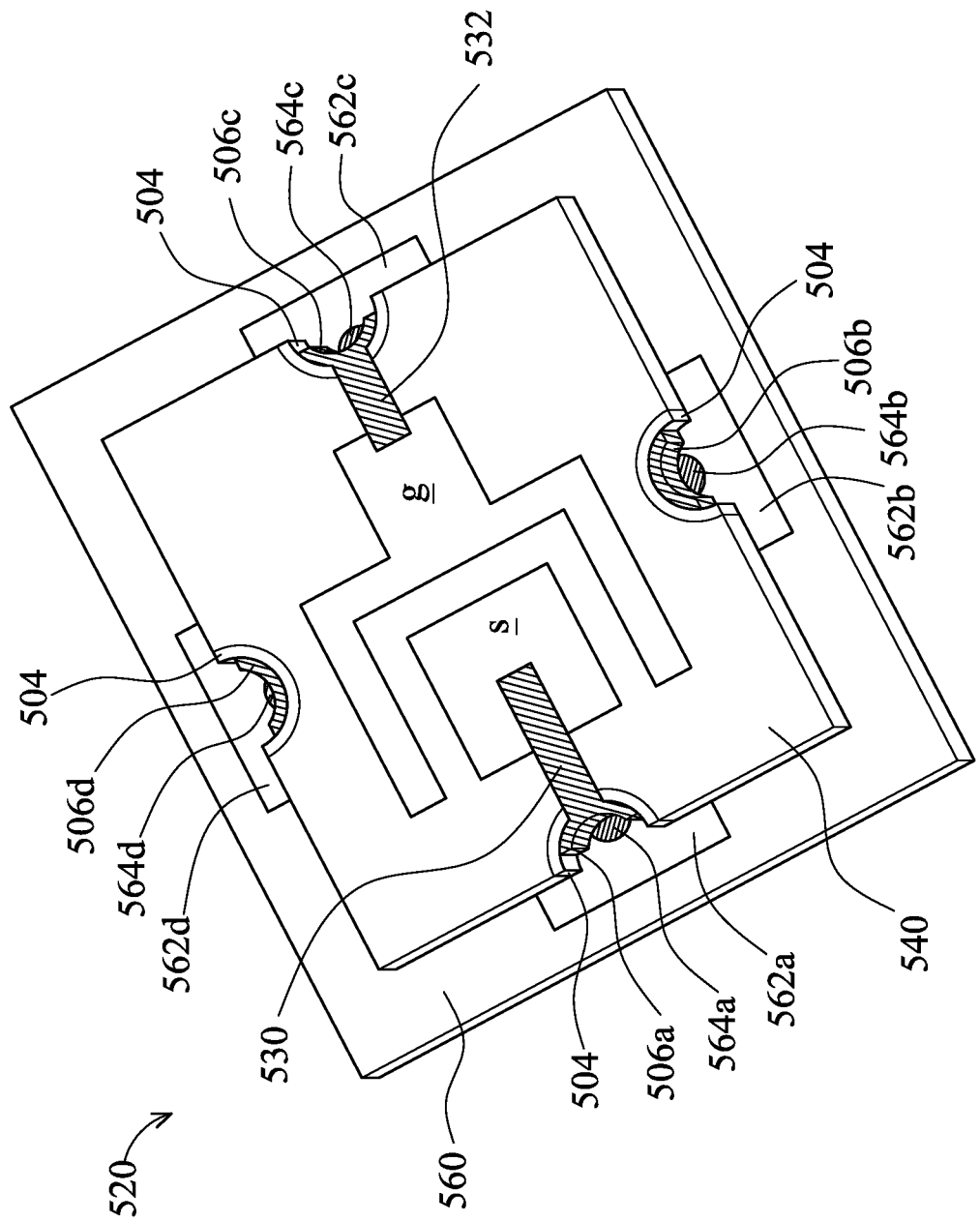
Figure 5F:
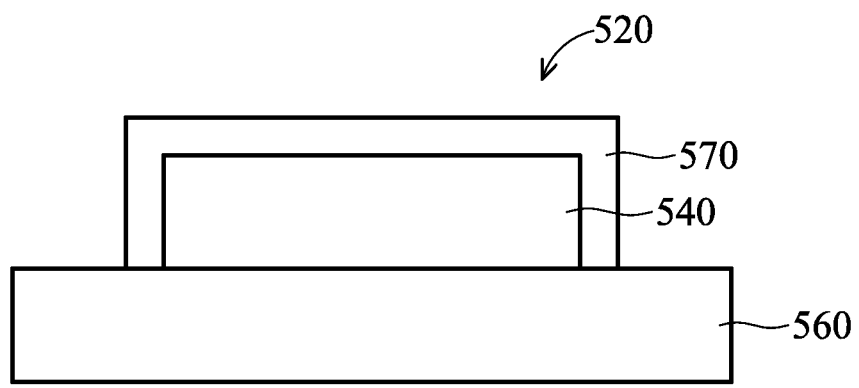

FIGS. 5A-5F are three-dimensional views showing the steps in forming a power MOSFET package according to an embodiment of the present invention. As shown in FIG. 5F, a wafer 500 is provided, in which a plurality of power MOSFETs are formed. The wafer 500 includes a plurality of predetermined scribe lines SC, which divide the wafer 500 into a plurality of regions. One of the regions has at least a power MOSFET. The power MOSFET may be formed by any conventional semiconductor process, which is not described herein. The structure of the power MOSFET may be similar to, but is not limited to, the structure shown in FIG. 2A.

FIG. 5B shows an enlarged three-dimensional view of the region A shown in FIG. 5A, which is used to illustrate the following processes of the power MOSFET package of the embodiment of the invention. It should be appreciated that the performance of the following described processes are not limited to region A. In this embodiment, similar or same processes are performed on a plurality of regions of the wafer 500 simultaneously. After a following dicing process along the scribe lines SC, a plurality of power MOSFET packages having sidewall contacts are formed.

As shown in FIG. 5B, the scribe lines SC surrounds a region R in the region A. The region R includes at least a power MOSFET. The power MOSFET may have a structure similar to that shown in FIG. 2A. The power MOSFET may include a semiconductor substrate having a first surface and an opposite second surface. The conductivity type of the semiconductor substrate may be a first conductivity type, such as an n-type. The semiconductor substrate forms a drain region. The power MOSFET further includes a doped region extending downward from the first surface. The conductivity type of the doped region may be a second conductivity type, such as a p-type. The power MOSFET further includes a source region located in the doped region. The conductivity type of the source region is the first conductivity type, such as an n-type. The power MOSFET further includes a gate formed overlying the first surface or buried under the first surface. A gate dielectric layer is located between the gate and the semiconductor substrate. For simplicity, the drain region, the source region, and the gate are not shown in FIG. 5B. The specific structure may, for example, refer to the structure shown in FIG. 2.

Then, as shown in FIG. 5C, a plurality of through-holes 502 penetrating through the wafer 500 are formed in the wafer 500. The positions of the through-holes 502 overlap some of the predetermined scribe lines SC. The through-hole 502 may be formed by, for example, a photolithography and an etching processes. Alternatively, in one embodiment, holes extending from one surface toward the opposite surface of the wafer 500 may first be formed. Then, the wafer 500 is thinned from the opposite surface by, for example, a CMP or grinding process until the previously formed holes are exposed, thus forming the through-holes 502 which penetrate through the wafer 500. In the following process, conducting layers will be formed overlying sidewalls of these through-holes to form a plurality of through-substrate conducting structures. These through-substrate conducting structures electrically contact with the gate, the source region, and the drain region, respectively, thus they are capable of serving as contacts of the power MOSFET.

Still referring to FIG. 5C, an insulating layer 504 is formed overlying the sidewalls of these through-holes 502, which is used to electrically isolate a subsequently formed conducting layer from the wafer 500. The insulating layer 504 may be, for example, an oxide layer, which may be formed by, for example, chemical vapor deposition. However, another manufacturing method and/or another material may be adopted to form the insulating layer 504.

Then, as shown in FIG. 5C, patterned conducting layers 506a, 506b, 506c, and 506d are formed overlying the insulating layer 504 in different through-holes 502. The patterned conducting layers are electrically connected to the gate, the source region, and the drain region, respectively. After undergoing a dicing process, the patterned conducting layers will serve as sidewall contacts of the power MOSFET. For example, the patterned conducting layer 506a may be electrically connected to the source region. The patterned conducting layer 506b may be electrically connected to the drain region. The patterned conducting layer 506c may be electrically connected to the gate. In this embodiment, the patterned conducting layer 506d is electrically connected to the drain region. However, the patterned conducting layer 506d and the corresponding through-holes are not necessary. In one embodiment, only three through-holes and the patterned conducting layers therein need to be formed. However, it should be appreciated that because the power MOSFET package according to an embodiment of the invention is preferably formed by wafer-level packaging, the patterned conducting layer 506d may be used as a sidewall contact of a neighboring power MOSFET even if the patterned conducting layer 506d may not be necessary for the power MOSFET in the region R.

In addition, as shown in FIG. 5C, all the patterned conducting layers in the through-holes 502 merely cover a portion of the corresponding through-hole. All of the patterned conducting layers do not cover the predetermined scribe lines SC. Therefore, when the wafer 500 is diced in the following process to separate a plurality of power MOSFET packages, the portions cut by a dicing blade do not include the patterned conducting layers, preventing the dicing blade from being damaged. In addition, what is more important is that the patterned conducting layers will not be pulled during the dicing of the wafer. Peelings of the patterned conducting layers are effectively prevented.

Figure 6A:
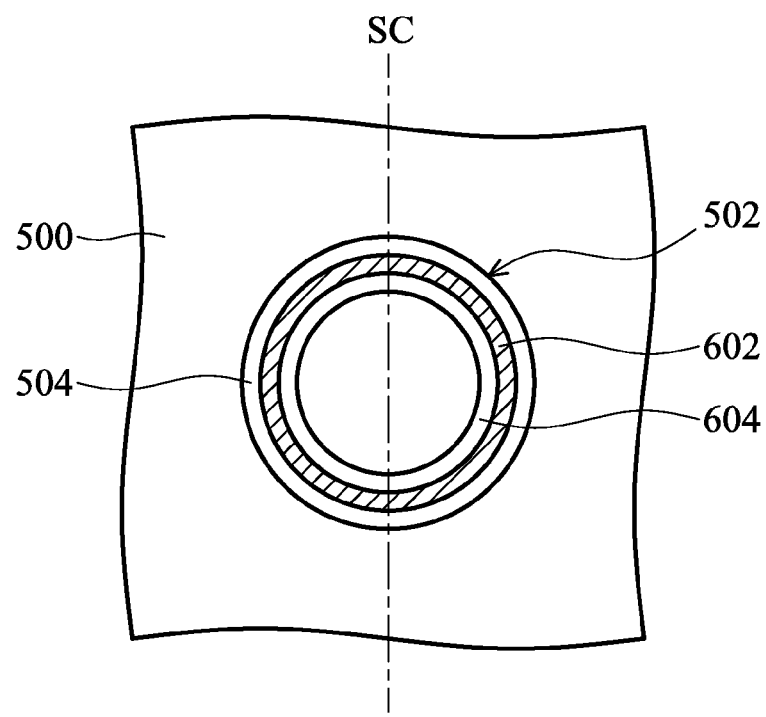
FIGS. 6A-6B are top views showing the steps of forming a patterned conducting layer in a through-hole according to an embodiment of the present invention.
Figure 6B:
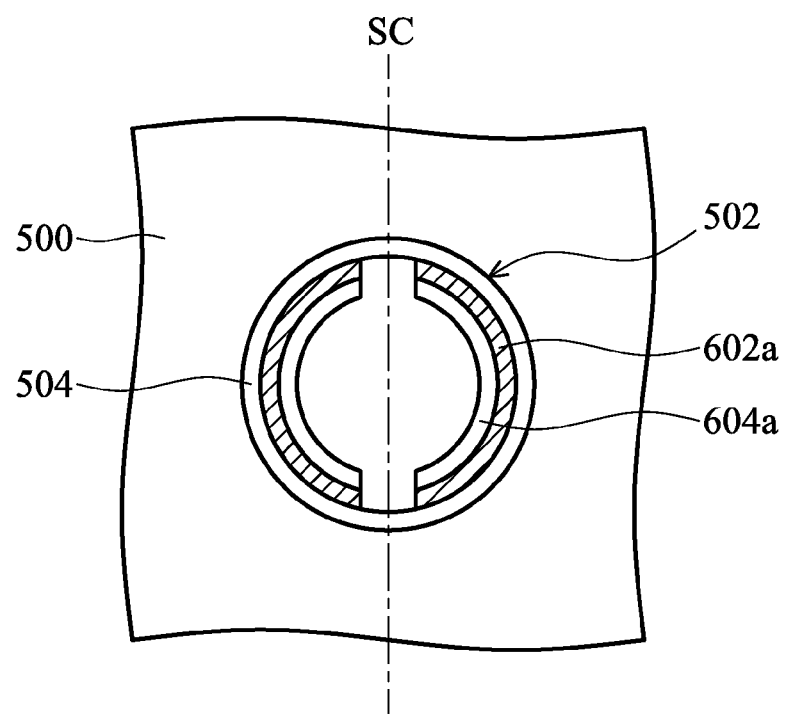

The forming of the patterned conducting layers in the through-holes mentioned above will be illustrated with references made to a series of top views shown in FIGS. 6A-6B. However, it should be appreciated that FIGS. 6A-6B merely show an exemplary forming method for the patterned conducting layers in the through-holes. The forming method of the patterned conducting layers is not limited thereto.

As shown in FIG. 6A, the insulating layer 504 is first formed overlying the sidewall of the through-hole 502, followed by forming a seed layer 602 overlying the insulating layer 504. The seed layer 602 may be formed by, for example, physical vapor deposition. The material of the seed layer 602 may be, for example, composed of copper. In addition, it is preferable that a diffusion barrier layer (not shown) is formed between the seed layer 602 and the wafer 500. The barrier layer may include, for example, TiW or TiCu, which may prevent copper from diffusion into the wafer 500. Further, adhesion between the seed layer 602 and the wafer 500 may be improved.

Then, as shown in FIG. 6A, a photoresist layer 604 is conformally formed overlying the seed layer 602. The photoresist layer 604 may be an electroplatable photoresist and thus can be conformally formed overlying the seed layer 602 by electroplating, wherein an electrode such as the seed layer 602 may be used.

Then, as shown in FIG. 6B, the photoresist layer 604 is patterned such that the portion near a region which is penetrated by the scribe lines SC of the photoresist layer 604 is removed. The seed layer 602 near the region penetrated by the scribe lines SC is exposed. Usually, the electroplatable photoresist layer is a negative photoresist. Thus, a shelter may be placed on the region near the predetermined scribe lines SC. The exposed photoresist layer 604 is irradiated with a light and thus hardened. Then, the photoresist non-irradiated area is removed and a patterned photoresist layer 604a is formed.

Then, as shown in FIG. 6B, the patterned photoresist layer 604a is used as a mask, and an etching process is performed on the seed layer 602. After the exposed seed layer 602 is removed, a patterned seed layer 602a is thus formed.

Thereafter, the patterned photoresist layer 604a may be removed. The patterned seed layer 602a is used as an electrode, and a conducting material is formed on the patterned seed layer 602a by electroplating to form patterned conducting layers, such as the patterned conducting layers 506a, 506b, 506c, and 506d shown in FIG. 5C. In one embodiment, during the forming of the patterned conducting layers, a variety of wiring layouts may be formed overlying the wafer 500 simultaneously. For example, redistribution layers may be formed. Therefore, the patterned conducting layers may be electrically connected to the gate, the source region, and the drain region of the power MOSFET, respectively.

Referring back to FIG. 5C, after the conducting layers (506a-d) are formed in the through-holes 502, the wafer 500 is diced along the predetermined scribe lines SC to form a plurality of separate power MOSFET packages. Because the conducting layer originally formed at the predetermined scribe lines SC is removed, the patterned conducting layers will not be cut during the dicing process. Damage to the dicing blade can be prevented. Peelings of the patterned conducting layers caused by pulling of the dicing blade can be effectively prevented, which in turn improves the reliability and yield of the device. FIG. 5D shows a three-dimensional view of one of the power MOSFET package 520.

As shown in FIG. 5D, the power MOSFET package 520 includes a semiconductor substrate 540. When the patterned conducting layers are defined, the redistribution layers may also be formed overlying the semiconductor substrate 540 simultaneously. For example, the redistribution layer 530 is used to provide an electrical connection between the patterned conducting layer 506a and the previously formed source region s in the semiconductor substrate 540. The redistribution layer 532 is used to provide an electrical connection between the patterned conducting layer 506c and the previously formed gate g in the semiconductor substrate 540. Similarly, a redistribution layer may also be formed overlying the semiconductor substrate 540, similar to the layer formed on the bottom surface of the semiconductor substrate 540 (not shown), which is used to provide an electrical connection between the patterned conducting layer 506b and/or 506d and the previously formed drain region in the semiconductor substrate 540. Therefore, in this embodiment, the patterned conducting layers 506a, 506b (and/or 506d), and 506c located on the side surfaces of the power MOSFET package 520 may serve as a source contact S, drain contact D, and gate contact G, respectively. These contacts located on the sidewalls may be used to integrate with other electronic elements, such as a printed circuit board.

In the embodiment shown in FIG. 5D, the power MOSFET package 520 includes the semiconductor substrate 540 having a first surface 540a and an opposite second surface 540b. The semiconductor substrate 540 has a first conductivity type, such as an n-type. The semiconductor substrate 540 forms a drain region (not shown in this figure; see FIG. 2A). The power MOSFET package 520 includes a doped region (not shown in this figure; see FIG. 2A) extending downward from the first surface 540a. The doped region has a second conductivity type, such as a p-type. The power MOSFET package 520 includes the source region s located in the doped region. The source region has the first conductivity type. The power MOSFET package 520 includes the gate g formed overlying the first surface 540a or buried under the first surface 540a. A gate dielectric layer is located between the gate and the semiconductor substrate 540 (not shown in this figure; see FIG. 2A).

In addition, as shown in FIG. 5D, the power MOSFET package 520 further includes a first trench 580 extending from the first side surface 590 of the semiconductor substrate 540 toward an inner portion of the semiconductor substrate 540 and extending from the first surface 540a toward the second surface 540b. A first conducting layer (i.e., the patterned conducting layer 506a) is formed overlying a sidewall of the first trench 580, wherein the first conducting layer is not coplanar with the first side surface 590 and separated from the first surface 590 by a first minimum distance d1. The first conducting layer is electrically connected to the source region s. The insulating layer 504 is located between the first conducting layer and the semiconductor substrate 540.

As shown in FIG. 5D, the power MOSFET package 520 further includes a second trench 582 extending from a second side surface 592 of the semiconductor substrate 540 toward the inner portion of the semiconductor substrate 540 and extending from the first surface 540a toward the second surface 540b. A second conducting layer (i.e., the patterned conducting layer 506b) is formed overlying a sidewall of the second trench 582, wherein the second conducting layer is not coplanar with the second side surface 592 and separated from the second surface 592 by a second minimum distance d2. The second conducting layer is electrically connected to the drain region (not shown in this figure; see FIG. 2A). The insulating layer 504 is located between the second conducting layer and the semiconductor substrate 540.

As shown in FIG. 5D, the power MOSFET package 520 further includes a third trench 584 extending from a third side surface 594 of the semiconductor substrate 540 toward the inner portion of the semiconductor substrate 540 and extending from the first surface 540a toward the second surface 540b. A third conducting layer (i.e., the patterned conducting layer 506c) is formed overlying a sidewall of the third trench 584, wherein the third conducting layer is not coplanar with the third side surface 594 and separated from the third surface 594 by a third minimum distance d3. The third conducting layer is electrically connected to the gate g. The insulating layer 504 is located between the third conducting layer and the semiconductor substrate 540.

As shown in FIG. 5E, the power MOSFET package 520 may be disposed overlying a printed circuit board 560. The printed circuit board 560 may include contact pads 562a, 562b, 562c, and 562d formed thereon. Then, conducting structures 564a, 564b (and/or 564d), and 564c are formed on interfaces between the patterned conducting layers 506a, 506b (and/or 506d), and 506c and the contact pads 562a, 562b (and/or 562d), and 562c, respectively. The conducting structures 564a, 564b (and/or 564d), and 564c may include solder material having electrical conductivity, which not only adheres and fixes to the patterned conducting layers and the contact pads, but also forms electrical connections therebetween. Because the conducting structures are formed on the sidewalls of the semiconductor substrate 540, it is easier to observe whether the soldering process or the deposition of conductors is successful. The process parameters may thus be adjusted accordingly and timely, further improving process yield. Then, as shown in FIG. 5F, a protection layer 570 is formed overlying the power MOSFET 520.

Figure 7A:
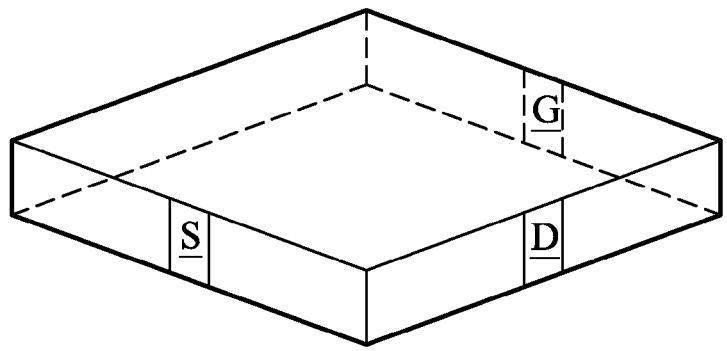
FIGS. 7A-7G are three-dimensional views of power MOSFET packages having sidewall contacts according to embodiments of the present invention.
Figure 7B:
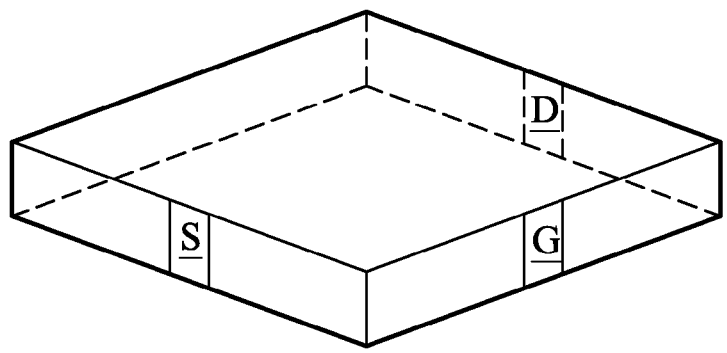
Figure 7C:
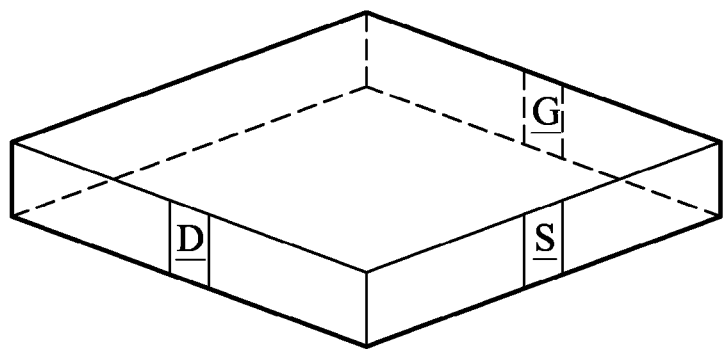
Figure 7D:
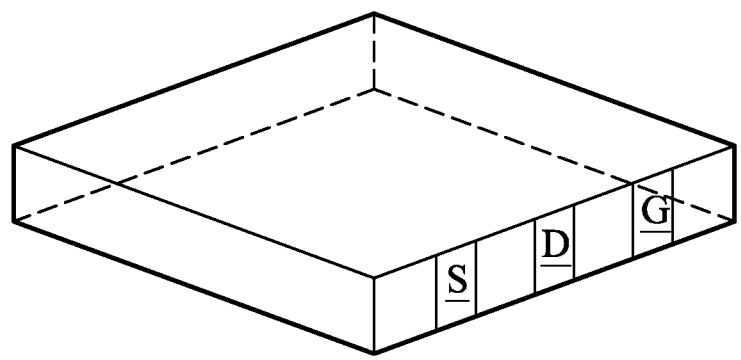
Figure 7E:
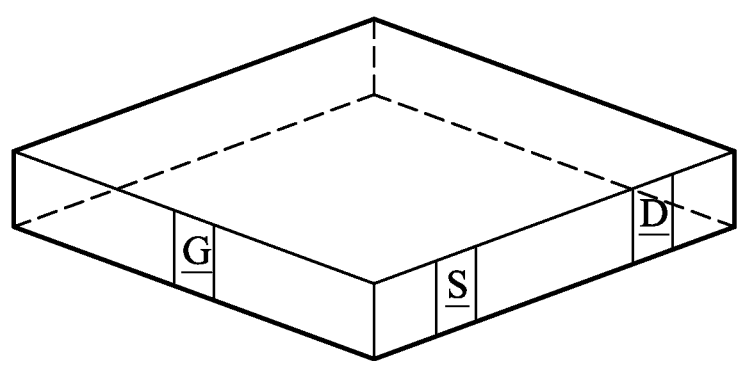
Figure 7F:
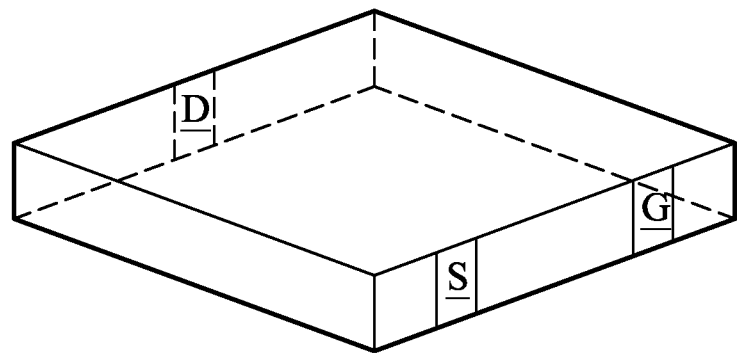
Figure 7G:
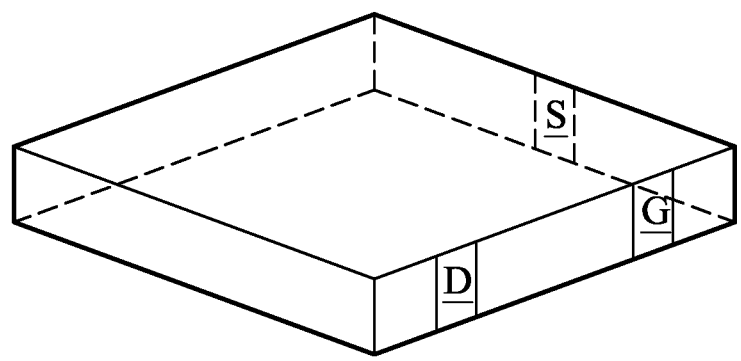

In addition, the power MOSFET package according to an embodiment of the present invention is not limited to the embodiments mentioned above. For example, in one embodiment, a plurality of through-holes, such as two or three, may be formed on the same scribe line. Thus, after the wafer is diced, it corresponds with redistribution layers and a plurality of sidewall contacts may be formed on a same side surface. FIGS. 7A-7G are three-dimensional views of power MOSFET packages having sidewall contacts according to embodiments of the present invention. Wherein, the source sidewall contact (i.e., the first conducting layer), the drain sidewall contact (i.e., the second conducting layer), and the gate sidewall contact (i.e., the third conducting layer) may be respectively located on different side surfaces of the semiconductor substrate and have a variety of relationships, as shown in FIGS. 7A-7C. In addition, in the embodiments shown in FIGS. 7D-7G, the same side surface of the semiconductor substrate may include a plurality of sidewall contacts formed thereon. For example, the side surface of the semiconductor substrate may include a source sidewall contact (i.e., the first conducting layer), a drain sidewall contact (i.e., the second conducting layer), and a gate sidewall contact (i.e., the third conducting layer) formed thereon. Alternatively, the side surface of the semiconductor substrate may include a source sidewall contact (i.e., the first conducting layer) and a drain sidewall contact (i.e., the second conducting layer) or a gate sidewall contact (i.e., the third conducting layer) formed thereon. Alternatively, the side surface of the semiconductor substrate may include a drain sidewall contact (i.e., the second conducting layer) and a gate sidewall contact (i.e., the third conducting layer) formed thereon.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A power MOSFET package, comprising:
a semiconductor substrate having a first surface and an opposite second surface, wherein the semiconductor substrate has a first conductivity type and forms a drain region;
a doped region extending downward from the first surface, the doped region having a second conductivity type;
a source region located in the doped region, the source region having the first conductivity type;
a gate formed overlying the first surface or buried under the first surface, wherein a gate dielectric layer is located between the gate and the semiconductor substrate;
a first conducting structure located overlying the semiconductor substrate and having a first terminal, the first conducting structure electrically connected to the drain region;
a second conducting structure located overlying the semiconductor substrate and having a second terminal, the second conducting structure electrically connected to the source region;
a third conducting structure located overlying the semiconductor substrate and having a third terminal, the third conducting structure electrically connected to the gate, wherein the first terminal, the second terminal, and the third terminal are substantially coplanar; and
a protection layer located between the semiconductor substrate and the first terminal, the second terminal, and the third terminal.

2. The power MOSFET package as claimed in claim 1, further comprising a first through-substrate conducting structure penetrating through the first surface and the second surface and electrically connected to the first conducting structure, wherein the first through-substrate conducting structure does not contact with the doped region or the source region.

3. The power MOSFET package as claimed in claim 2, the first through-substrate conducting structure is electrically connected to the first conducting structure through a redistribution layer overlying the semiconductor substrate.

4. The power MOSFET package as claimed in claim 2, wherein a first insulating layer is located between the first through-substrate conducting structure and the semiconductor substrate.

5. The power MOSFET package as claimed in claim 2, further comprising a drain electrode layer located overlying the second surface and electrically connected to the drain region, the drain electrode layer electrically connected to the first through-substrate conducting structure.

6. The power MOSFET package as claimed in claim 1, further comprising a second through-substrate conducting structure electrically connected to the source region and the second conducting structure, the second through-substrate conducting structure extending from the source region toward the second surface and exposed at the second surface.

7. The power MOSFET package as claimed in claim 6, wherein the second through-substrate conducting structure is electrically connected to the second conducting structure through a redistribution layer overlying the semiconductor substrate.

8. The power MOSFET package as claimed in claim 6, wherein a second insulating layer is located between the second through-substrate conducting structure and the semiconductor substrate.

9. The power MOSFET package as claimed in claim 1, further comprising a third through-substrate conducting structure electrically connected to the gate and the third conducting structure, the third through-substrate conducting structure extending from the gate toward the second surface and exposed at the second surface, wherein a third insulating layer is located between the third through-substrate conducting structure and the semiconductor substrate.

10. The power MOSFET package as claimed in claim 9, wherein the third through-substrate conducting structure is electrically connected to the third conducting structure through a redistribution layer overlying the semiconductor substrate.

* * * * *